United States Patent [19]
Fujibayashi

[11] 4,417,165
[45] Nov. 22, 1983

[54] MUTING CIRCUIT

[75] Inventor: Kenji Fujibayashi, Tokyo, Japan

[73] Assignee: Olympus Optical Co., Ltd., Tokyo, Japan

[21] Appl. No.: 380,950

[22] Filed: May 21, 1982

Related U.S. Application Data

[63] Continuation of Ser. No. 118,996, Feb. 6, 1980, abandoned.

[30] Foreign Application Priority Data

Mar. 26, 1979 [JP] Japan .............................. 54-38924[U]

[51] Int. Cl.³ .......................... H03K 5/00; H03K 17/60
[52] U.S. Cl. ..................... 307/540; 307/542; 307/549; 307/254
[58] Field of Search ............... 307/254, 540, 542, 547, 307/546, 550; 336/149; 328/54

[56] References Cited

U.S. PATENT DOCUMENTS

| | | | |
|---|---|---|---|
| 3,263,091 | 7/1966 | Cole et al. | 307/254 |
| 3,469,173 | 9/1969 | Ohashi et al. | 307/549 |
| 3,636,385 | 1/1972 | Koepp | 307/550 |
| 3,737,678 | 6/1973 | Dolby et al. | 330/149 |

Primary Examiner—Larry N. Anagnos
Assistant Examiner—B. P. Davis

[57] ABSTRACT

A muting circuit having a first resistor (R10) one end (a) of which is supplied with an input signal, a second resistor (R12) serially connected to the first resistor, a first transistor (14) whose collector is connected to the junction point (b) of the first and second resistors, and a second transistor (16) whose collector is connected to the other end (c) of the second resistor. The emitters of the first and second transistors are grounded, and the bases thereof are supplied with a DC muting signal. An output signal derived from the other end of the second resistor is attenuated when the muting signal is supplied to the first and second transistors.

3 Claims, 3 Drawing Figures

MUTING CIRCUIT

This is a continuation of application Ser. No. 118,996 filed Feb. 6, 1980, now abandoned.

BACKGROUND OF THE INVENTION

This invention relates to a muting circuit used with audio equipment and apparatus which employs analogue signals within the audio frequency range.

In order to intercept signal transmission when handling a non desired signal, a muting circuit is incorporated into the reproducing (playback) circuit or the like of a tape recorder. In this case, the muting circuit functions so as to pass musical and other signals only when the operation mode of a tape desk is playback mode. Unless the muting circuit is provided, clicks may be caused when the operation mode is switched, or some noise attributable to the amplifier system will possibly be reproduced in the stop mode. The muting circuit is expressly vital to a tape deck of a type in which a reproducing head is brought into slidable contact with a recording tape in the fast forward or the rewinding mode.

Conventionally, the muting circuit of the aforesaid type uses a one-stage attenuator combining series resistors with switching elements (bipolar transistor or FET). With such one-stage muting circuit, the attenuation obtained during muting operation may be −40 dB to −50 dB at the most.

In the case of the above-mentioned tape recorder which performs fast forward and rewinding operations with the recording tape slidably touched by the reproducing head, however, the level of the signal to be muted is very high. Therefore, the attenuation ranging from −40 dB to −50 dB would usually be unsatisfactory. It is not advisable to increase the resistance value of the series resistor in order to augment the attenuation degree at muting, because the transmission loss will thence be increased while the muting operation is off. Thus, according to the prior art muting circuit, a high attenuation degree at muting would never be compatible with a small off-muting transmission loss.

SUMMARY OF THE INVENTION

The object of this invention is to provide a muting circuit capable of achieving substantial attenuation during muting operation and minimizing transmission loss when the circuit is off the muting operation.

In order to attain the above object, a muting circuit according to this invention comprises a first impedance element one end of which is supplied with an input signal, a signal impedance element one end of which is connected to the other end of the first impedance element so that an output signal corresponding to the input signal is derived from the other end of the second impedance element, a first transistor whose collector-emitter path is connected to the other end of the first impedance element and a circuit with zero AC potential, a second transistor whose collector-emitter path is connected to the other end of the second impedance element and the zero-potential circuit, and means for simultaneously supplying a DC muting signal to the respective bases of the first and second transistors, whereby the value of transfer function obtained between the one end of the first impedance element and the other end of the second impedance element is attenuated when the muting signal is applied to the first and second transistors.

In the muting circuit of the above-mentioned construction, a sufficient attenuation degree can be obtained by turning on the first and second transistors, so that the impedances of the first and second impedance elements may be relatively low. Accordingly, the signal attenuation at muting can fully be increased while minimizing the off-muting transmission loss.

DETAILED DESCRIPTION OF THE PREFERRED EMBODIMENTS

Figure 1:
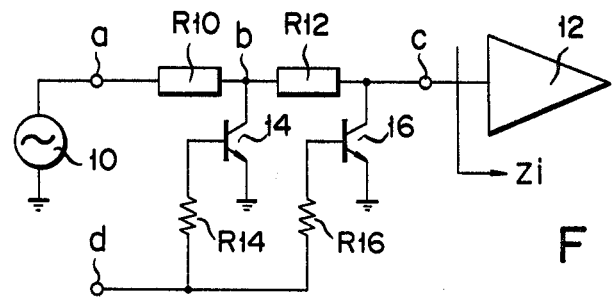
FIG. 1 is a basic circuit diagram of a muting circuit according to an embodiment of this invention.

There will now be described preferred embodiments of this invention with reference to the accompanying drawings. For the ease of explanation, common or like reference numerals refer to common or like parts throughout the several views of the drawings.

FIG. 1 shows a basic arrangement of a muting circuit according to this invention. In this circuit, an input signal generated by a signal source 10 is applied to one end (a) of a first impedance element R10. The other end (b) of the first impedance element R10 is connected to one end of a second impedance element R12. The other end (c) of the second impedance element R12 is connected to the input terminal of an amplifier 12 with input impedance Zi. The other end (b) of the first impedance element R10 is grounded by way of the collector-emitter path of an NPN-type first switch transistor 14. Likewise, the other end (c) of the second impedance element R12 is grounded by way of the collector-emitter path of an NPN-type second switch transistor 16. The bases of the first and second switch transistors 14 and 16 are connected to a muting signal input terminal (d) via resistors R14 and R16 respectively. When a positive DC muting signal is applied to the input terminal (d), the transistors 14 and 16 are turned on. An output signal is derived from the other end (c), with the input signal muted or unmuted.

Figure 2:
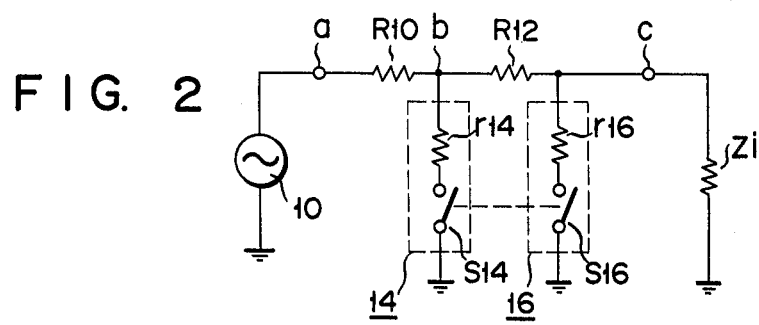
FIG. 2 is an equivalent circuit of the muting circuit of FIG. 1.

FIG. 2 shows an equivalent circuit of the muting circuit of FIG. 1. The signal source 10 is connected to the one end (a), which is connected to the other end (c) via the resistor R10 as the first impedance element and the resistor R12 as the second impedance element. The junction point (b) of the resistors R12 and R14 is grounded by way of a resistor r14 and a switch S14. The resistor r14 and switch S14 correspond to the first switch transistor 14. The resistor r14 represents the on-resistance of the first switch transistor 14. The other end (c) is grounded by way of a resistor r16 and a switch S16. The resistor r16 and switch S16 correspond to the second switch transistor 16. The resistor r16 represents the on-resistance of the second switch transistor 16. The other end (c) is grounded also by way of a resistor Zi corresponding to the input impedance of the amplifier 12.

Supposing that there are relations $r14=r16=r<<(R10, R12)<Zi$, for simplicity, there will be described a transfer function obtained between the two ends (a) and (c). When the switches S14 and S16 are both on, that is, during a muting operation, transfer function G1 may approximately be given by $$G1 \simeq r^2/(R10 \cdot R12). \quad (1)$$

On the other hand, when the switches S14 and S16 are both off, that is, when the circuit is off the muting operation, transfer function G2 obtained may approximately be given by $$G2 \simeq Z_i/(R10+R12+Z_i). \quad (2)$$

Substituting specific values for the terms of eqs. (1) and (2), the effect of muting by means of the arrangement of FIG. 1 is examined. First, let it be assumed that the input impedance $Z_i$ of the amplifier 12 is 100 KΩ, R10=R12=10 KΩ, and r14=r16=50Ω. This supposition is practical. From eq. (1), we obtain $$G1 \simeq 50^2/10^8 \simeq 0.25 \times 10^{-4} \simeq -92 \text{ dB}$$

From eq. (2), we obtain $$G2 \simeq 10^5/1.2 \times 10^5 \simeq 0.83 \simeq -1.6 \text{ dB}$$

That is, on the above assumption, the transmission loss and attenuation in the muting circuit are −1.6 dB and −92 dB respectively.

Figure 3:
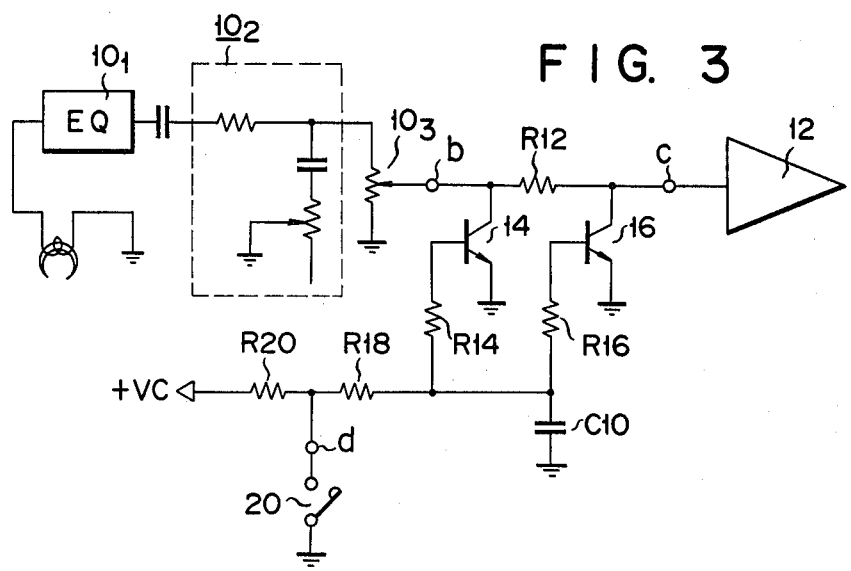
FIG. 3 is a circuit diagram of part of a reproducing circuit of a tape recorder provided with the muting circuit of FIG. 1.

According to the muting circuit of this invention, as is evident from the above description, a small transmission loss and a high degree of muting attenuation may be provided at a time. Moreover, this effect can be obtained with use of such a simple arrangement as shown in FIG. 1. The muting circuit shown in FIG. 1 has simple construction in harmony with satisfactory muting effect. Namely, it can be regarded as a muting circuit with extremely high cost-performance. Further, it is noticeable that the first impedance element R10 can be replaced with an internal impedance on the signal source 10 side. Let us suppose, for example, that the signal source 10 is a reproducing equalizer amplifier $10_1$ whose output is connected to the point (b) through a tone control circuit $10_2$ and a volume controller $10_3$, as shown in FIG. 3. In this case, the internal impedance of the tone control circuit $10_2$ and volume controller $10_3$ may be utilized for the first impedance element R10.

In FIG. 3, the bases of the transistors 14 and 16 are biased by positive voltage +Vc through resistors R14, R16, R18 and R20. Accordingly, in the circuit arrangement of FIG. 3, a muting operation is performed when the junction point (d) of the resistors R18 and R20 is opened by the turning-off of a switch 20. The junction point of the resistors R14, R16 and R18 is grounded by way of a capacitor C10. By the charge and discharge of the capacitor C10, the on-off switching of the muting operation by means of the switch 20 can smoothly be done.

The muting circuit of FIG. 1 has a two-stage configuration in which the switch transistors 14 and 16 are concatenated in two stages. This two-stage configuration may, however, be developed into a three-stage configuration. By the use of this concatenation or cascade connection of three or more stage, the attenuation at the muting operation can be further increased.

Furthermore, the first and second impedance elements R10 and R12 may include reactance components. The type of these impedance elements may variously be changed according to other circuit or circuits to which the muting circuit of the invention is applied.

What is claimed is:

1. A muting circuit comprising:
   an input circuit which receives an input signal of the muting circuit and provides a first signal corresponding to said input signal, said input circuit having a given circuit impedance;
   a volume control circuit having a given circuit impedance, which is provided with an input terminal for receiving said first signal, an output terminal for providing a second signal and a ground terminal coupled to a circuit with zero AC potential, a ratio between the magnitude of said second signal to that of said first signal being varied under control of said volume control circuit;
   an impedance element having two terminals, one terminal of which is coupled to the output terminal of said volume control circuit and the other terminal of which provides an output signal of said muting circuit;
   a first bipolar transistor which has a collector coupled to the one terminal of said impedance element and an emitter coupled to said zero AC potential circuit;
   a second bipolar transistor which has a collector coupled to the other terminal of said impedance element and an emitter coupled to said zero AC potential circuit; and
   muting signal supply means coupled to each base of said first and second transistors for simultaneously supplying a DC muting signal, said muting signal supply means including a first resistor connected at one end to a base of said first transistor, and a second resistor connected at one end to a base of said second transistor, the other ends of said first and second resistors being connected to each other, and the resistance values of said first and second resistors being so selected that said first and second transistors are turned on substantially at the same time when said muting signal is supplied thereto.

2. A muting circuit of claim 1, wherein the connection point of said first and second resistors is coupled to said zero AC potential circuit via a capacitor for the smooth starting and ending of the muting operation.

3. A muting circuit of any one of claims 1 or 2, wherein said input circuit includes a reactance element for varying the frequency response thereof.

* * * * *